US012631824B2

(12) United States Patent
Szelag

(10) Patent No.: US 12,631,824 B2
(45) Date of Patent: May 19, 2026

(54) PROCESS FOR FABRICATING AN OPTOELECTRONIC DEVICE COMPRISING A GERMANIUM-ON-SILICON PHOTODIODE OPTICALLY COUPLED TO AN INTEGRATED Si₃N₄ WAVEGUIDE

(71) Applicant: Commissariat à l'Energie Atomique et aux Energies Alternatives, Paris (FR)

(72) Inventor: Bertrand Szelag, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 191 days.

(21) Appl. No.: 18/359,374

(22) Filed: Jul. 26, 2023

(65) Prior Publication Data

US 2024/0069282 A1     Feb. 29, 2024

(30) Foreign Application Priority Data

Jul. 28, 2022     (FR) ..................................... 22 07816

(51) Int. Cl.
    G02B 6/13          (2006.01)
    G02B 6/132         (2006.01)
    (Continued)

(52) U.S. Cl.
    CPC ........... G02B 6/132 (2013.01); H10F 30/223 (2025.01); H10F 71/121 (2025.01);
    (Continued)

(58) Field of Classification Search
    CPC .......... G02B 6/132; G02B 2006/12061; G02B 2006/12123; H10F 77/413; H10F 77/122; H10F 30/223; H10F 71/121
    (Continued)

(56) References Cited

U.S. PATENT DOCUMENTS

2015/0325736 A1     11/2015   Knoll et al.
2016/0197111 A1*     7/2016   Coolbaugh ........... H10F 39/806
                                                          438/69
(Continued)

FOREIGN PATENT DOCUMENTS

CN          111933753 A      11/2020
CN          112201723 A       1/2021

OTHER PUBLICATIONS

Extended European Search Report Issued Sep. 7, 2023 in European Application 23187953.7, (with English translation of cited categories), 14 pages.

(Continued)

*Primary Examiner* — Jerry M Blevins
(74) *Attorney, Agent, or Firm* — Oblon, McClelland, Maier & Neustadt, L.L.P.

(57)     ABSTRACT

A process for fabricating an optoelectronic device having a germanium-on-silicon photodiode coupled to an Si₃N₄ waveguide includes producing a semiconductor substrate having a semiconductor stack of thin layers configured to form segments of a semiconductor structure of the photodiode, producing a photonic substrate having the Si₃N₄

(Continued)

waveguide, and transferring and bonding the semiconductor substrate to the photonic substrate. The photodiode is produced by photolithography and etching of the semiconductor stack to form the semiconductor structure which is then located above the waveguide.

18 Claims, 5 Drawing Sheets

(51) Int. Cl.

| | |
|---|---|
| *H10F 30/223* | (2025.01) |
| *H10F 71/00* | (2025.01) |
| *H10F 77/122* | (2025.01) |
| *H10F 77/40* | (2025.01) |
| *G02B 6/12* | (2006.01) |

(52) U.S. Cl.
CPC ......... *H10F 77/122* (2025.01); *H10F 77/413* (2025.01); *G02B 2006/12061* (2013.01); *G02B 2006/12123* (2013.01)

(58) Field of Classification Search
USPC .......................................................... 385/14
See application file for complete search history.

(56) References Cited

U.S. PATENT DOCUMENTS

| | | | |
|---|---|---|---|
| 2018/0031765 A1* | 2/2018 | Hassan | G02B 6/122 |
| 2020/0124791 A1* | 4/2020 | Bayn | G02B 6/1228 |
| 2020/0313026 A1* | 10/2020 | Szelag | G02B 6/136 |
| 2023/0194789 A1* | 6/2023 | Virot | H01L 21/02645 |
| | | | 385/14 |

OTHER PUBLICATIONS

Costanzo et al., "Low-Noise Balanced Photoreceiver with InP-on-Si Photodiodes and SiGe BiCMOS Transimpedance Amplifier", IEEE, Journal of Lightwave Technology, vol. 39, No. 14, 2021, pp. 4837-4846, XP011866246.

Piels et al., "Low-Loss Silicon Nitride AWG Demultiplexer Heterogeneously Integrated with Hybrid III-V/Silicon Photodetectors", IEEE, Journal of Lightwave Technology, vol. 32, No. 4, 2014, pp. 817-823, XP011537160.

Hu et al., "180 Gbit/s $Si_3N_4$-waveguide coupled germanium photodetector with improved quantum efficiency", Optics Letters, vol. 46, No. 24, 2021, pp. 6019-6022, XP093024024.

Ahn et al., "Efficient evanescent wave coupling conditions for waveguide-integrated thin-film Si/Ge photodetectors on silicon-on-insulator/germanium-on-insulator substrates", Journal of Applied Physics, vol. 110, 083115, 2011, 9 pages, XP012150788.

French Preliminary Search Report issued Feb. 20, 2023 in French Application 22 07816 filed on Jul. 28, 2022, 13 pages (with English Translation of Categories of Cited Documents and Written Opinion).

Benedikovic et al., "Silicon-germanium receivers for short-wave-infrared optoelectronics and communications: High-speed silicon-germanium receivers (invited review)" Nanophotonics, vol. 10, No. 3, 2021 pp. 1059-1079.

* cited by examiner

PROCESS FOR FABRICATING AN OPTOELECTRONIC DEVICE COMPRISING A GERMANIUM-ON-SILICON PHOTODIODE OPTICALLY COUPLED TO AN INTEGRATED Si₃N₄ WAVEGUIDE

TECHNICAL FIELD

The field of the invention is that of optoelectronic devices comprising a germanium-on-silicon photodiode optically coupled to a waveguide made of a silicon nitride, and more precisely of $Si_3N_4$.

PRIOR ART

There is a need to provide germanium-based photodiodes, to detect a guided optical mode having a wavelength notably comprised between 1300 and 1550 nm depending on the intended application, telecoms for example, the photodiodes being optically coupled to a waveguide made of stoichiometric silicon nitride ($Si_3N_4$). Specifically, such a material is transparent in this spectral range and exhibits very low optical losses in transmission.

However, fabricating such an optoelectronic device presents difficulties that are notably related to integration constraints. Thus, it may be necessary to perform an anneal at a high temperature, of the order of 1000° C., to decrease propagation losses in the silicon-nitride ($Si_3N_4$) guide, this potentially being incompatible with the thermal budget of the active components that have already been produced.

In this respect, the document by Lischke et al. titled *Silicon nitride waveguide coupled 67+ GHz Ge photodiode for non-SOI PIC and ePIC platforms*, 2019 IEEE International Electron Devices Meeting (IEDM), 2019, 33.2.1-33.2.4 describes an optoelectronic device comprising a germanium-based photodiode optically coupled to a waveguide made of a non-stoichiometric silicon nitride. Here, the germanium of the absorbing segment of the photodiode is grown epitaxially from bulk silicon substrate, and the SiN waveguide is then produced above the germanium absorbing segment.

The waveguide is produced via plasma-enhanced chemical vapor deposition (PECVD) at low temperature, so as to respect the thermal budget and thus not to degrade the doped segments and the active components that have already been produced. Thus, this approach does not allow a waveguide made of stoichiometric silicon nitride ($Si_3N_4$) to be obtained.

Another possible approach consists in producing the waveguide, then made of $Si_3N_4$, on top of a silicon-on-insulator (SOI) substrate, then in producing the germanium-on-silicon (Ge-on-Si) photodiode from the same SOI substrate. The paper by Hu et al. titled *180 Gbit/s $Si_3N_4$-waveguide coupled germanium photodetector with improved quantum efficiency*, Opt. Lett. 46, 6019 (2021) describes such an optoelectronic device, in which $Si_3N_4$ waveguides are arranged laterally and on either side of the germanium absorbing segment of the photodiode. However, this approach suffers from stringent integration constraints in terms of the sizing of the various elements and their mutual positioning. By way of example, the risk of leakage of the guided modes into the thick silicon layer of the SOI substrate remains high, and may degrade the performance of the optoelectronic device.

SUMMARY OF THE INVENTION

The objective of the invention is to remedy at least in part the drawbacks of the prior art, and more particularly to provide a process allowing an optoelectronic device comprising a Ge-on-Si photodiode optically coupled to an integrated $Si_3N_4$ waveguide to be fabricated. The performance of the optoelectronic device is good, and the process allows the aforementioned integration constraints—in terms of thermal budget, sizing and positioning—to be limited or even to be eliminated.

To this end, one subject of the invention is a process for fabricating an optoelectronic device comprising a germanium-on-silicon photodiode optically coupled to an $Si_3N_4$ waveguide, the photodiode comprising a semiconductor structure formed from a lower doped segment that is based on silicon doped a first conductivity type, an upper segment that is doped a second conductivity type opposite the first type and that is based on silicon and/or germanium, and preferably made of silicon, and an intermediate absorbing segment that is based on germanium and located between the lower and upper doped segments along a thickness axis of the photodiode.

According to the invention, the method comprises the following steps:

producing what is referred to as a semiconductor substrate, comprising a semiconductor stack of thin layers intended to form the segments of the semiconductor structure;

producing what is referred to as a photonic substrate, comprising a carrier layer and comprising the $Si_3N_4$ waveguide; producing said substrate comprising a step of producing the waveguide from a stoichiometric silicon nitride $Si_3N_4$, followed by a step of annealing the waveguide at a temperature at least equal to 1000° C.;

transferring and bonding the semiconductor substrate to the photonic substrate after the annealing step;

producing the photodiode, by photolithography and etching of the semiconductor stack, to form the semiconductor structure which is then located above the waveguide.

The following are certain preferred but non-limiting aspects of this fabricating process.

The process may comprise, in the step of producing the photodiode, a step of producing the upper doped segment and the intermediate absorbing segment by localized etching of a thin upper doped layer and of a thin intermediate layer based on germanium of the semiconductor stack, the etching being stopped on a thin lower doped layer of the semiconductor stack that is intended to form the lower doped segment.

The process may comprise, after the step of producing the upper doped segment and the intermediate absorbing segment, a step of producing spacers that are based on an electrically insulating material, these being placed against the flanks of the intermediate absorbing segment, and extending over one portion of the thin lower doped layer or the lower doped segment.

The process may comprise, after the step of producing the upper doped segment and the intermediate absorbing segment, a step of producing the lower doped segment by localized etching of a thin lower doped layer, so that the lower doped segment has lateral portions that are not covered.

The process may comprise, after the step of producing the lower doped segment, a step of producing lateral conductive segments made of an electrically conductive material, these being located on and in contact with an upper face of the lateral portions of the lower doped segment, by siliciding the silicon-based material of the lower doped segment.

The process may comprise a step of producing a central conductive segment that is made of an electrically conductive material and located on and in contact with an upper face of the upper doped segment, the latter being based on silicon, by siliciding the silicon-based material of the upper doped segment at the same time as the silicon-based material of the lower doped segment is silicided.

The process may comprise a step of depositing an insulating encapsulation layer so as to cover the semiconductor structure, then a step of producing contact metallizations comprising lateral conductive vias passing through the insulating encapsulation layer to make contact with the lateral conductive segments.

The process may comprise a step of covering the carrier layer with a lower dielectric layer that has a thickness of at least 2 μm to prevent optical leakage toward the carrier layer.

The invention also relates to an optoelectronic device comprising:
   a germanium-on-silicon photodiode, comprising a semiconductor structure formed from a lower doped segment that is based on silicon, an upper doped segment, and an intermediate absorbing segment that is based on germanium and located between the lower and upper doped segments along a thickness axis of the photodiode;
   an $Si_3N_4$ waveguide integrated into and optically coupled to the photodiode.

According to the invention, the waveguide is located below the photodiode along a thickness axis of the photodiode, and is integrated into a photonic substrate on which the photodiode rests; the device comprising:
   an upper dielectric layer covering the integrated waveguide and a lower dielectric layer on which the waveguide rests,
   so that
   the waveguide is optically coupled to the photodiode evanescently via the intermediate dielectric layer.

The photonic substrate may comprise a carrier layer and a lower dielectric layer on which the waveguide rests, the waveguide being spaced apart from the carrier layer by at least 2 μm.

The lower doped segment may have a transverse dimension larger than that of the intermediate absorbing segment, spacers that are based on an electrically insulating material being placed against the flanks of the intermediate absorbing segment and extending over one portion of the upper face of the lower doped segment.

The optoelectronic device may comprise lateral conductive segments that are made of a silicide, and located on and in contact with an upper face of lateral portions of the lower doped segment that are not covered by the spacers.

The upper segment may be based on silicon. The optoelectronic device may comprise a central conductive segment that is made of a silicide, and located on and in contact with an upper face of the upper doped segment.

The optoelectronic device may comprise an Insulating encapsulation layer covering the semiconductor structure and the lateral and central conductive segments, and contact metallizations comprising lateral conductive vias passing through the insulating encapsulation layer to make contact with the lateral conductive segments, and at least one central conductive via passing through the insulating encapsulation layer to make contact with the central conductive segment.

BRIEF DESCRIPTION OF THE DRAWINGS

Other aspects, aims, advantages and features of the invention will become more clearly apparent on reading the following detailed description of preferred embodiments thereof, which description is given by way of non-limiting example, with reference to the appended drawings, in which.

DETAILED DESCRIPTION OF PARTICULAR EMBODIMENTS

In the figures and in the remainder of the description, the same references have been used to designate identical or similar elements. In addition, the various elements have not been shown to scale for the sake of clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean inclusive of limits, unless indicated otherwise.

The invention relates to a process for fabricating an optoelectronic device, and to the optoelectronic device itself, comprising a germanium-on-silicon photodiode optically coupled to an integrated waveguide made of $Si_3N_4$, i.e. stoichiometric silicon nitride.

Figure 1:
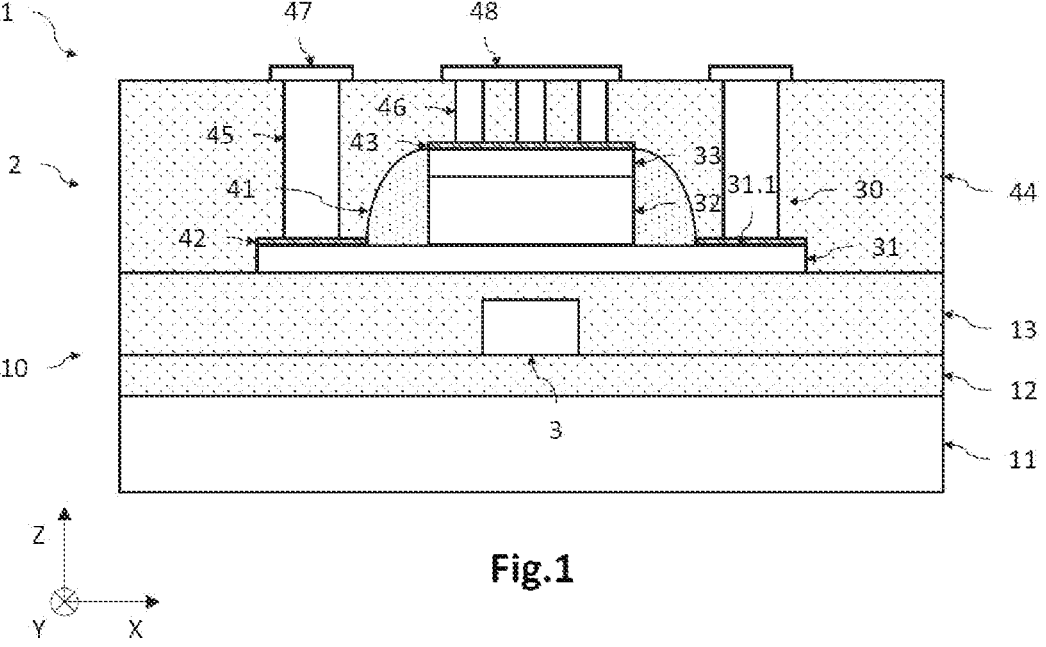
FIG. 1 is a schematic and partial cross-sectional view of an optoelectronic device comprising a Ge-on-Si photodiode optically coupled to an integrated $Si_3N_4$ waveguide placed under the photodiode, according to one embodiment.

FIG. 1 is a schematic and partial cross-sectional view of an optoelectronic device 1 according to one embodiment.

An orthogonal three-dimensional direct coordinate system XYZ is defined here and will be referred to in the remainder of the description, the XY plane being a plane parallel to the plane of the photonic substrate 10 and in which the integrated waveguide 3 lies, the longitudinal axis Y being oriented along the axis of optical coupling of the latter to the photodiode 2, and the vertical axis Z being oriented from the integrated waveguide 3 toward the photodiode 2. Moreover, the terms "lower" and "upper" will be understood to relate to positions of increasing distance in the +Z-direction.

The optoelectronic device 1 comprises a Ge-on-Si photodiode 2, which rests on a photonic substrate 10 in which the integrated $Si_3N_4$ waveguide 3 is located.

The substrate 10 is said to be photonic insofar as it comprises the $Si_3N_4$ waveguide 3, which is thus called an integrated waveguide. It may comprise an integrated photonic circuit formed from the waveguide 3 optionally coupled to other waveguides.

The photonic substrate 10 here comprises a carrier layer 11, which is for example made of the same material (silicon for example, it then being a bulk silicon substrate) or of a stack of different materials, and which has a thickness of the order of several hundred microns.

A lower dielectric layer 12 covers the carrier layer 11 and participates in forming the low-refractive-index cladding of the integrated waveguide 3. It may be made of an oxide, for example here a silicon oxide. It has a thickness sufficient to prevent optical leaks from the guided mode toward the carrier layer, for example a thickness of at least 2 μm, and of the order of 2 to 3 μm.

The integrated waveguide 3 therefore rests on the lower dielectric layer 12. It is made of $Si_3N_4$, and hence the optical losses in transmission of the guided mode are particularly low. In this example, the integrated waveguide 3 is a strip guide (of rectangular cross section) but, as a variant, it may be a ridge guide formed from a slab and a rib. Other forms are of course possible.

An upper dielectric layer 13 covers the integrated waveguide 3 and the lower dielectric layer 12. It also plays a role in forming the cladding of the waveguide. It may also be made of an oxide, for example here a silicon oxide. In this example, it defines the upper face of the photonic substrate 10, and here allows oxide-oxide direct bonding with a thin oxide bonding layer 26 (cf. FIG. 2D) of the semiconductor substrate 20 once the latter has been transferred to the photonic substrate 10. It also allows a spacing with respect to the photodiode 2 to be ensured in order to allow good optical coupling, here via evanescence, with the photodiode 2.

The photodiode 2 comprises a semiconductor structure 30. i.e. such as a pad, formed from segments of thin semiconductor layers 31, 32, 33. More precisely, the semiconductor structure 30 comprises a stack, in the +Z-direction, of a lower doped segment 31, of an intermediate absorbing segment 32, and of an upper doped segment 33. Insofar as the photodiode 2 is a Ge-on-Si photodiode, the intermediate absorbing segment 32 is based on germanium and the lower doped segment 31 is based on p-doped silicon.

The lower doped segment 31 is based on silicon doped a first conductivity type, here p-type. In this example, it is made of silicon. Here it extends over and in contact with the thin bonding layer 26 (cf. FIG. 2D). It has a transverse dimension larger than that of the intermediate and upper segments 32, 33, and hence it comprises at least one lateral portion 31.1, and here two lateral portions, that are not covered by the latter and that extend on either side, along the axis X, away from the intermediate and upper segments 32, 33. These lateral portions 31.1 allow the lower doped segment 31 to be electrically biased laterally.

The intermediate absorbing segment 32 is based on unintentionally doped germanium (intrinsic germanium or lightly p-doped germanium). In this example, it is made of germanium. It extends over and in contact with the lower doped segment 31 and has a transverse dimension smaller than the latter. It is the site of absorption of the optical mode to be detected, and has a thickness tailored to maximize absorption. The germanium is here under mechanical tensile strain in the XY plane, and hence the cutoff wavelength of absorption may here be at least equal to 1550 nm.

The upper doped segment 33 is made of a semiconductor doped a second conductivity type opposite the first type, here n-type. It may be based on silicon and/or germanium, and is preferably made of silicon.

In one embodiment, the photodiode 2 comprises lateral conductive segments 42 that are located on and in contact with the lateral portions 31.1 of the lower doped segment 31, and that are made of an electrically conductive material, and here of a silicide. They improve the electrical contact between the lower doped segment 31 and the conductive vias 45.

In one embodiment, the photodiode 2 also comprises spacers 41, which take the form of insulating lateral segments made of an electrically insulating material, for example a silicon nitride and/or tetraethyl orthosilicate (TEOS). These spacers 41 ensure physical separation, along the axis X, between the lateral conductive segments 42 and the intermediate absorbing segment 32.

In this embodiment, in which the upper doped segment 33 is made of silicon, a central conductive segment 43 may be located on and in contact with the latter. It is made of an electrically conductive material, and here of a silicide. It improves the electrical contact between the upper doped segment 33 and the, one or more, conductive vias 46.

The photodiode 2 comprises an insulating encapsulation layer 44, which covers the semiconductor structure 30 and extends over the photonic substrate 10. To allow the photodiode 2 to be electrically biased, provision is made for contact metallizations, namely, here, lateral conductive vias 45 and at least one central conductive via 46, which extend through the insulating encapsulation layer 44, here to make contact with the lateral conductive segments 42 and with the central conductive segment 43, respectively. Conductive pads 47, 48 may be provided on and in contact with the upper ends of the conductive vias 45, 46 to facilitate electrical connection.

The optoelectronic device 1 therefore comprises a Ge-on-Si photodiode 2 optically coupled, by evanescence, to an integrated waveguide 3 made of $Si_3N_4$ located under the photodiode 2, and more precisely plumb with the intermediate absorbing segment 32. Thus, the performance of the optoelectronic device 1 is good, because the integrated waveguide 3 is made of $Si_3N_4$ and an anneal at high temperature (at least 1000° C., for example 1000° C. or about 1100° C.) was able to be carried out (without causing degradation of the other active components or doped segments), and not merely of non-stoichiometric silicon nitride. In addition, the integrated waveguide 3 is placed under the photodiode 2 and not laterally beside or above it, and may thus be spaced apart from the thick layer 11 of the photonic substrate 10 by a distance that limits optical losses by leakage of the mode guided therein. Moreover, as explained below, the fact that the integrated waveguide 3 is placed under the photodiode 2, and not laterally beside or above it, allows production constraints in terms of sizing, positioning and thermal budget to be relaxed.

FIGS. 2A to 2J illustrate various steps of a process for fabricating the optoelectronic device 1 according to one embodiment, the optoelectronic device 1 being similar to the one illustrated in FIG. 1.

Figure 2A:
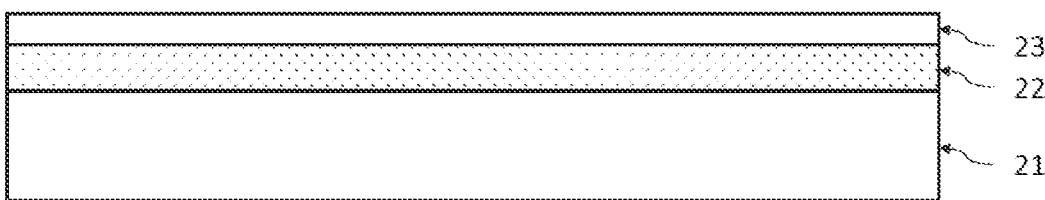
FIGS. 2A to 2J illustrate various steps of a process for fabricating the optoelectronic device according to one embodiment, the optoelectronic device being similar to the one illustrated in FIG. 1.
Figure 2B:
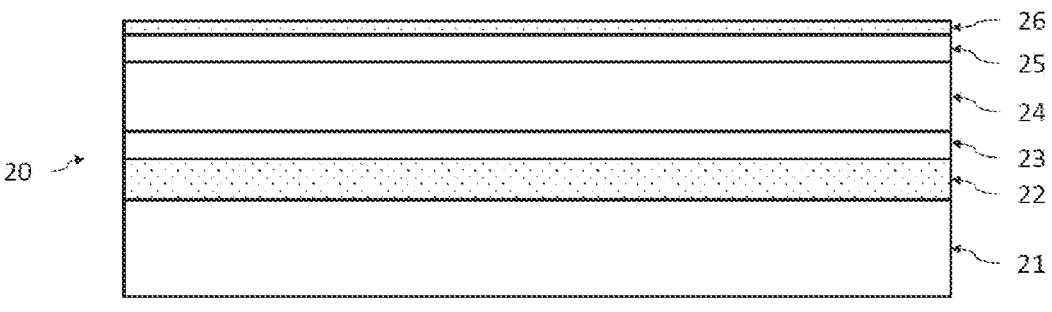

With reference to FIGS. 2A and 2B, a first substrate, which is referred to as the semiconductor substrate 20 insofar as it comprises a stack of thin semiconductor layers 23, 24, 25 intended for production of the semiconductor structure 30, is produced.

Firstly, an SOI or GeOI substrate is produced (FIG. 2A), this substrate being formed by a stack of a carrier layer 21, here a bulk silicon substrate, of a buried oxide (BOX) layer 22 that covers the carrier layer 11 and the thickness of which is preferably equal to about 145 nm, and of a thin silicon-based semiconductor layer 23 the thickness of which is preferably equal to 70 nm. In this example, the substrate is an SOI substrate and the thin semiconductor layer 23 is made of single-crystal silicon. As a variant, the substrate may be a GeOI substrate and the thin semiconductor layer 23 would then be made of single-crystal germanium.

Next, the semiconductor stack is produced by epitaxy (FIG. 28). The thin semiconductor layer 23 is first doped by ion implantation, for example with phosphorus, then an anneal is carried out to activate the dopants, so as thus to obtain a first thin doped layer 23, here one made of n-doped silicon. Next, a thin intermediate layer 24 of unintentionally doped germanium is produced by epitaxy from the thin doped layer 23, then a second thin layer 25 based on p-doped silicon. This thin doped layer 25 is here made of silicon and the doping, with boron, is preferably carried out during growth. Preferably, a thin bonding layer 26, made of an oxide, is deposited on the thin doped layer 25. It will be noted that, following production of the semiconductor stack by epitaxy, the thin intermediate layer 24 is under mechanical tensile strain in the XY plane, because of the differential thermal expansion between the silicon and germanium. The cutoff frequency of absorption of the photodiode 2 will then possibly be at least equal to 1550 nm.

Figure 2C:
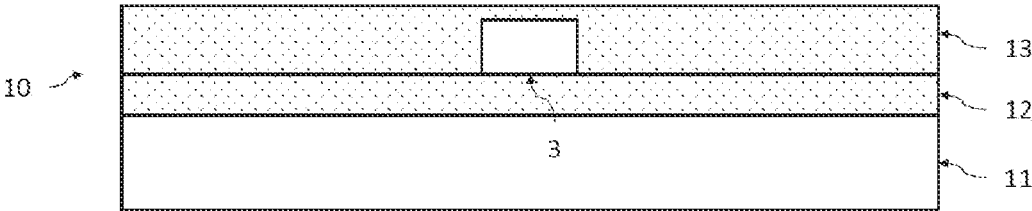

With reference to FIG. 2C, the photonic substrate 10 is then produced. As indicated above, it comprises a carrier layer 11, for example a bulk silicon substrate; a lower dielectric layer 12, for example one made of an oxide; the integrated waveguide 3; and an upper dielectric layer 13 made of an oxide. The waveguide 3 here belongs to an integrated photonic circuit located in the photonic substrate 10. It may have been produced by low-pressure chemical vapor deposition (LPCVD) followed by an anneal at high temperature (of the order of 1000° C.). An integrated Si₃N₄ waveguide 3 is thus obtained, the optical losses in transmission of which are greatly decreased. A surface treatment may be carried out in preparation for direct oxide/oxide bonding of the semiconductor substrate 20 to the photonic substrate 10.

Figure 2D:
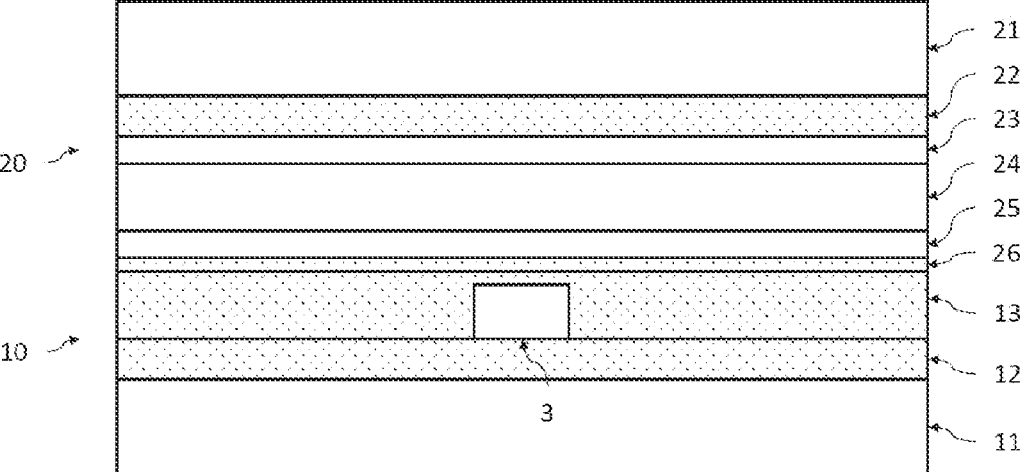

With reference to FIG. 2D, the semiconductor substrate 20 is transferred to the photonic substrate 10, by bringing the thin bonding layer 26 into contact with the upper dielectric layer 13. The semiconductor substrate 20 is then bonded to the photonic substrate 10 by direct bonding, here of oxide/oxide type.

Figure 2E:
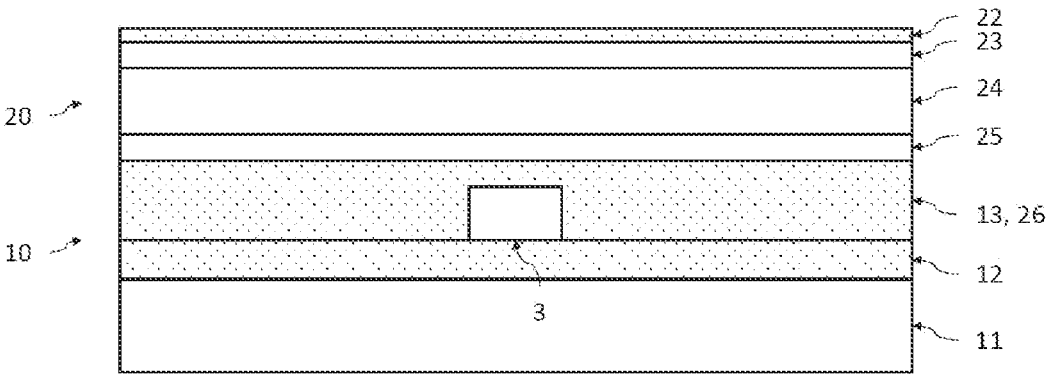

With reference to FIG. 2E, the carrier layer 21 of the semiconductor substrate 20 is removed or eliminated, for example by mechanical thinning followed by wet etching with hydrochloric acid. The buried oxide layer 22 is then thinned uniformly over its entire area.

Figure 2F:
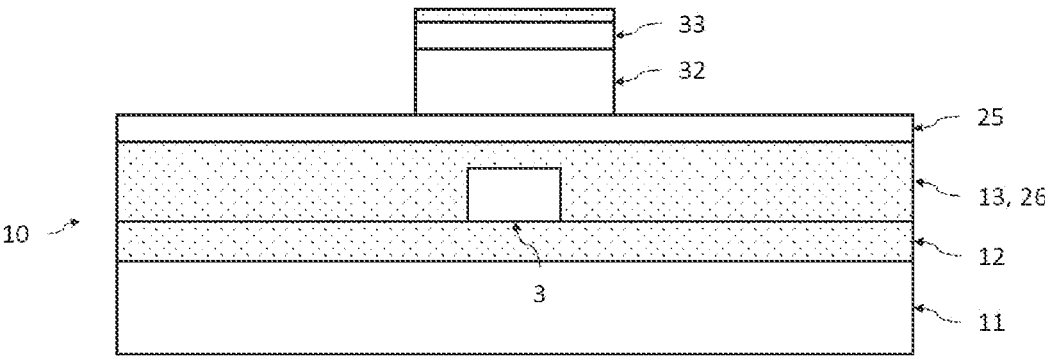

With reference to FIG. 2F, the thin n-doped layer 23 and the intermediate layer 24 are structured so as thus to obtain the n-doped upper segment 33 and the intermediate absorbing segment 32, respectively. The structuring may be carried out by photolithography and localized etching, for example dry etching with etching stopped through detection of cessation of attack on the thin p-doped layer 25. The n-doped upper segment 33 and the intermediate absorbing segment 32 are positioned above and plumb with the integrated waveguide 3 by means of lithography marks produced beforehand in the photonic substrate 10.

Figure 2G:
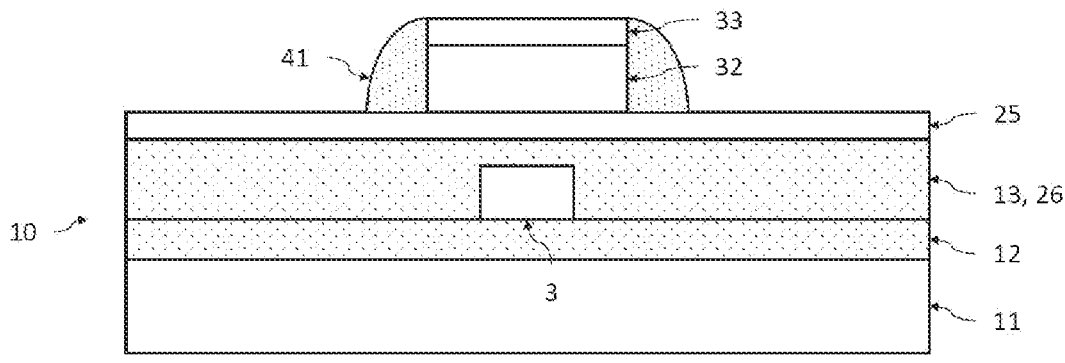

With reference to FIG. 2G, spacers 41 are produced on either side of the intermediate absorbing segment 32. To do this, a hard-mask layer (not shown) made of an electrically insulating material, for example of a silicon nitride and/or of tetraethyl orthosilicate (TEOS), is deposited in a conformal manner, so as to continuously cover the n-doped upper segment 33, the intermediate absorbing segment 32 and the thin p-doped layer 25. Next, the hard-mask layer is etched by dry etching with etching stopped through detection of cessation of attack on the silicon of the n-doped upper segment 33 and of thin p-doped layer 25. Two spacers 41 are thus obtained that are located against and in contact with the flanks of the n-doped upper segment 33 and of the intermediate absorbing segment 32. The upper face of the n-doped upper segment 33 is thus freed, as is an area not covered by the spacers 41 of the upper face of the thin p-doped layer 25.

Figure 2H:
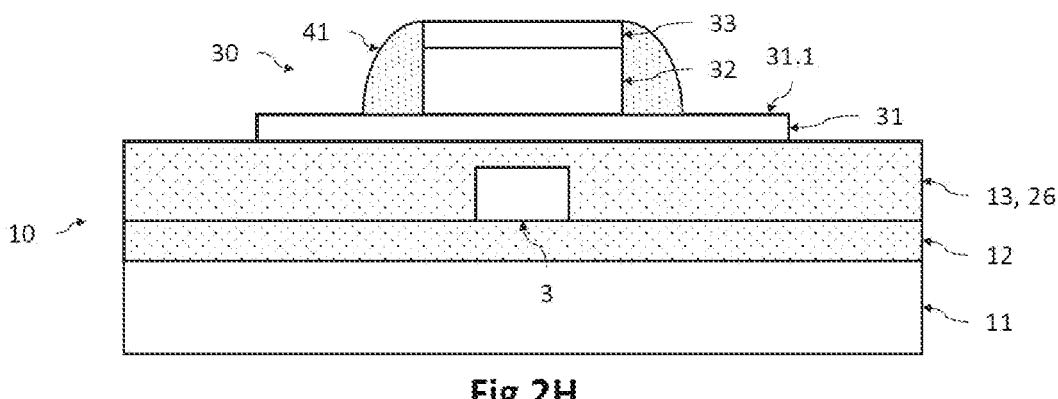

With reference to FIG. 2H, the p-doped lower segment 31 is then produced. It will be noted that this step may be carried out before the spacers 41 are formed. The p-doped lower segment 31 may be produced by lithography and etching of the thin p-doped layer 25 by dry etching with etching stopped through detection of cessation of attack on the oxide of the thin bonding layer 26. The p-doped lower segment 31 thus has a central portion covered by the intermediate absorbing segment 32 and by the spacers 41, and lateral portions 31.1 that are not covered.

Figure 2I:
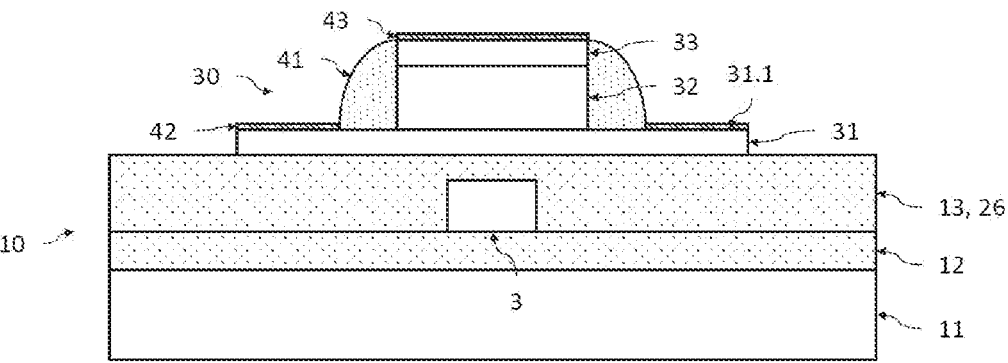

With reference to FIG. 2I, the lateral conductive segments 42, and here the central conductive segment 43, are then produced. These lateral and central segments 42, 43 are advantageously produced simultaneously insofar as the n-doped upper segment 33 and the p-doped lower segment 31 are here both made of silicon. They are made of an electrically conductive material. This material is preferably a silicide of a transition metal, for example a nickel silicide NiSi₂. To produce them, by way of example, a continuous thin layer of nickel Ni, for example with a thickness of 9 nm, is deposited so as to continuously cover the upper face of the n-doped upper segment 33 and the upper face of the lateral portions 31.1 of the p-doped lower segment 31, then a continuous thin layer of titanium nitride TiN, for example with a thickness of 10 nm, is deposited. A siliciding anneal is then carried out to form localized zones of NiSi₂ in contact with the n-doped upper segment 33 and the lateral portions 31.1 of the p-doped lower segment 31. A wet etching step allows zones that have not silicided to be removed. Lateral conductive segments 42 and a central conductive segment 43 made of NiSi₂ are thus obtained.

Figure 2J:
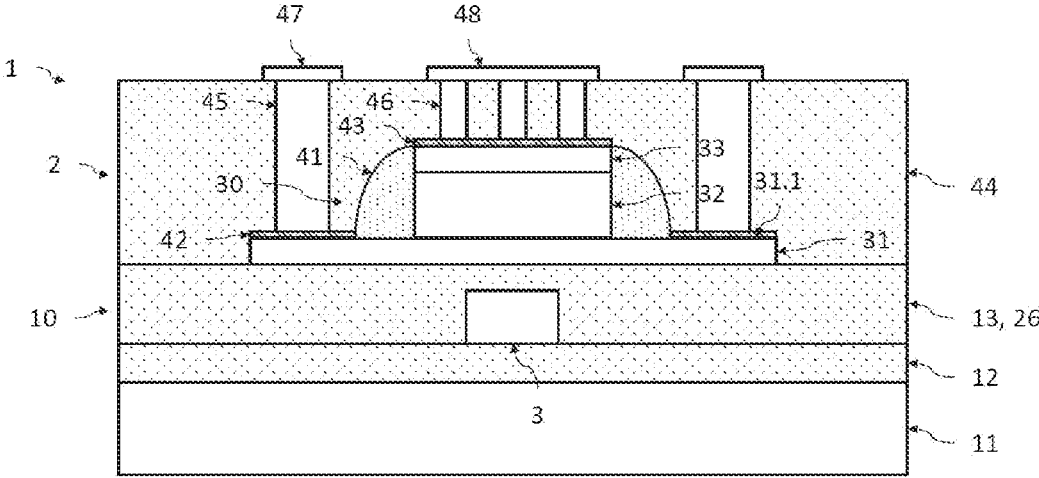

With reference to FIG. 2J, production of the photodiode 2 is finalized. To do this, an insulating encapsulation layer 44 is deposited so as to cover the semiconductor structure 30 and the photonic substrate 10, followed by planarization. Contact metallizations are then produced to allow the photodiode 2 to be electrically biased. They here comprise lateral conductive vias 45 and central conductive vias 46 that extend through the insulating encapsulation layer 44, here to make contact with the lateral conductive segments 42 and with the central conductive segment 43, respectively. Contact pads 47, 48 may be produced on the insulating encapsulation layer 44 to facilitate electrical connection.

Thus, the process allows an optoelectronic device 1 that performs well to be fabricated, by producing then direct bonding after transfer, on the one hand a photonic substrate 10 comprising the integrated Si₃N₄ waveguide 3, and on the other hand a semiconductor substrate 20 intended to form the semiconductor structure 30 of the photodiode 2. The step of annealing to decrease propagation losses in the Si₃N₄ waveguide is carried out before the step of transferring and bonding, just like the steps of doping the thin doped layers 23 and 25. These substrates 10, 20 are thus 'pre-functionalized' before the step of transferring and bonding, this thus allowing integration constraints in terms of thermal budget once the step of transferring and bonding has been carried out to be relaxed. The silicon of the p-doped lower segment 31 has the advantage of both stopping etching during production of the n-doped upper segment 33 and the intermediate absorbing segment 32, and of allowing a silicide to be formed that improves electrical contact between the p-doped lower segment 31 and the conductive via 45.

Moreover, the integrated waveguide 3 is placed under the photodiode 2 and not laterally beside or above it, this simplifying production of the integrated photonic circuit. It is optically coupled to the photodiode 2 evanescently via an intermediate dielectric layer 13, 26 that has a uniform thickness of about a few hundred nanometers, and about equal to 200 nm for example. It is lastly spaced a sufficient distance from the carrier layer 11 to limit optical leakage of the guided mode, 2 to 3 μm for example.

Particular embodiments have just been described. Various variants and modifications will seem obvious to anyone skilled in the art.

The invention claimed is:

1. A process for fabricating an optoelectronic device comprising a germanium-on-silicon photodiode optically coupled to an $Si_3N_4$ waveguide, the photodiode comprising a semiconductor structure formed from a lower doped segment that is based on a silicon material doped a first conductivity type, an upper segment that is doped a second conductivity type opposite the first type and that is based on silicon and/or germanium, and an intermediate absorbing segment that is based on germanium and located between the lower and upper doped segments along a thickness axis of the photodiode, the process comprising:

producing a semiconductor substrate comprising a semiconductor stack of thin layers configured to form the segments of the semiconductor structure;

producing a photonic substrate comprising a carrier layer and comprising the waveguide, producing the photonic substrate comprising producing the waveguide from a stoichiometric silicon nitride $Si_3N_4$, followed by annealing the waveguide at a temperature at least equal to 1000° C.;

transferring and bonding the semiconductor substrate to the photonic substrate after the annealing; and producing the photodiode by photolithography and etching the semiconductor stack to form the semiconductor structure which is located above the waveguide.

2. The fabricating process according to claim 1, wherein producing the photodiode comprises producing the upper doped segment and the intermediate absorbing segment by localized etching of a thin upper doped layer and of a thin intermediate layer based on germanium of the semiconductor stack, the etching being stopped on a thin lower doped layer of the semiconductor stack that is configured to form the lower doped segment.

3. The fabricating process according to claim 2, comprising, after producing the upper doped segment and the intermediate absorbing segment, producing spacers that are based on an electrically insulating material, the spacers being placed against flanks of the intermediate absorbing segment and extending over one portion of the thin lower doped layer or the lower doped segment.

4. The fabricating process according to claim 2, comprising, after producing the upper doped segment and the intermediate absorbing segment, producing the lower doped segment by localized etching of a thin lower doped layer so that the lower doped segment has lateral portions that are not covered.

5. The fabricating process according to claim 4, comprising, after producing the lower doped segment, producing lateral conductive segments made of an electrically conductive material, the lateral conductive segments being located on and in contact with an upper face of the lateral portions of the lower doped segment by siliciding the silicon-based material of the lower doped segment.

6. The fabricating process according to claim 5, comprising producing a central conductive segment that is made of an electrically conductive material and located on and in contact with an upper face of the upper doped segment, the latter being based on silicon by siliciding the silicon-based material of the upper doped segment at a same time as the silicon-based material of the lower doped segment is silicided.

7. The fabricating process according to claim 5, comprising depositing an insulating encapsulation layer so as to cover the semiconductor structure, then producing contact metallizations comprising lateral conductive vias passing through the insulating encapsulation layer to make contact with the lateral conductive segments.

8. The fabricating process according to claim 1, comprising covering the carrier layer with a lower dielectric layer that has a thickness of at least 2 μm to prevent optical leakage toward the carrier layer.

9. The fabricating process according to claim 1, wherein the upper segment is made of silicon.

10. An optoelectronic device, comprising:

a germanium-on-silicon photodiode comprising a semiconductor structure formed from a lower doped segment that is based on silicon, an upper doped segment, and an intermediate absorbing segment that is based on germanium and located between the lower and upper doped segments along a thickness axis of the photodiode; and a photonic substrate comprising:

an $Si_3N_4$ waveguide; and an intermediate dielectric layer covering the waveguide and a lower dielectric layer on which the waveguide rests, wherein the waveguide is located below the photodiode along a thickness axis of the photodiode, and is integrated into the photonic substrate, wherein the photodiode is attached to the intermediate dielectric layer of the photonic substrate via a direct bonding process, and wherein the waveguide is optically coupled to the photodiode evanescently via the intermediate dielectric layer.

11. The optoelectronic device according to claim 10, wherein the photonic substrate comprises a carrier layer and the lower dielectric layer on which the waveguide rests, the waveguide being spaced apart from the carrier layer by at least 2 μm.

12. The optoelectronic device according to claim 10, wherein the upper doped segment is based on silicon, and the device comprises a central conductive segment that is made of a silicide and located on and in contact with an upper face of the upper doped segment.

13. The optoelectronic device according to claim 12, comprising an insulating encapsulation layer covering the semiconductor structure and the lateral and central conductive segments, and contact metallizations comprising lateral conductive vias passing through the insulating encapsulation layer to make contact with the lateral conductive segments, and at least one central conductive via passing through the insulating encapsulation layer to make contact with the central conductive segment.

14. The optoelectronic device according to claim 10, wherein the waveguide is made of stoichiometric $Si_3N_4$.

15. The optoelectronic device according to claim 10, wherein the intermediate absorbing segment is epitaxially formed from the upper doped segment.

16. The optoelectronic device according to claim 10, wherein the waveguide bas a structure resulting from being exposed to a temperature at least equal to 1000° C.

17. An optoelectronic device, comprising:

a germanium-on-silicon photodiode comprising a semiconductor structure formed from a lower doped segment that is based on silicon, an upper doped segment, and an intermediate absorbing segment that is based on germanium and located between the lower and upper doped segments along a thickness axis of the photodiode; and an $Si_3N_4$ waveguide integrated into and optically coupled to the photodiode;

wherein the waveguide is located below the photodiode along a thickness axis of the photodiode, and is integrated into a photonic substrate on which the photodiode rests, the device comprising:

an intermediate dielectric layer covering the waveguide and a lower dielectric layer on which the waveguide rests, wherein the waveguide is optically coupled to the photodiode evanescently via the intermediate dielectric layer, and wherein the lower doped segment has a transverse dimension larger than that of the intermediate absorbing segment, spacers that are based on an electrically insulating material being placed against flanks of the intermediate absorbing segment and extending over one portion of an upper face of the lower doped segment.

18. The optoelectronic device according to claim 17, comprising lateral conductive segments that are made of a silicide and located on and in contact with an upper face of lateral portions of the lower doped segment that are not covered by the spacers.

\*   \*   \*   \*   \*